US012624449B2

(12) United States Patent
Dickey

(10) Patent No.: US 12,624,449 B2
(45) Date of Patent: May 12, 2026

(54) METHODS AND SYSTEMS FOR INHIBITING PRECURSOR INTERACTIONS DURING RADICAL-ENHANCED ATOMIC LAYER DEPOSITION

(71) Applicant: LOTUS APPLIED TECHNOLOGY, LLC, Beaverton, OR (US)

(72) Inventor: Eric Dickey, Beaverton, OR (US)

(73) Assignee: LOTUS APPLIED TECHNOLOGY, LLC, Hillsboro, OR (US)

( * ) Notice: Subject to any disclaimer, the term of this patent is extended or adjusted under 35 U.S.C. 154(b) by 0 days.

(21) Appl. No.: 18/456,806

(22) Filed: Aug. 28, 2023

(65) Prior Publication Data

US 2024/0368760 A1 Nov. 7, 2024

Related U.S. Application Data

(60) Provisional application No. 63/500,521, filed on May 5, 2023.

(51) Int. Cl.
*C23C 16/455* (2006.01)
*H01J 37/32* (2006.01)
(52) U.S. Cl.
CPC .. *C23C 16/45536* (2013.01); *C23C 16/45557* (2013.01); *C23C 16/45563* (2013.01); *H01J 37/32357* (2013.01); *H01J 37/32816* (2013.01); *H01J 37/32899* (2013.01); *H01J 2237/327* (2013.01); *H01J 2237/332* (2013.01)
(58) Field of Classification Search
CPC ........ C23C 16/45536; C23C 16/45557; C23C 16/45563; H01J 37/32357; H01J 37/32816; H01J 37/32899; H01J 2237/327; H01J 2237/332
See application file for complete search history.

(56) References Cited

U.S. PATENT DOCUMENTS

| 6,471,925 B1 * | 10/2002 | Merchant | B01D 53/864 |
| | | | 423/247 |
| 2008/0026162 A1 | 1/2008 | Dickey et al. | |
| 2010/0037820 A1 * | 2/2010 | Lee | C23C 16/45551 |
| | | | 118/719 |

(Continued)

OTHER PUBLICATIONS

PCT International Search Report for PCT/US2024/027853, mailing date Aug. 7, 2024, 3 pages.

(Continued)

*Primary Examiner* — Yuechuan Yu
(74) *Attorney, Agent, or Firm* — Miller Nash LLP

(57) ABSTRACT

This disclosure relates to methods and systems for inhibiting precursor interactions during radical-enhanced atomic layer deposition. A substrate may be completely exposed to a precursor gas. Meanwhile, a gaseous radical species is directed through a shroud towards the substrate. The gaseous radical species flows through the shroud under sufficient flow and pressure conditions to substantially prevent the precursor gas from flowing into the shroud. The shroud can be alternately positioned over selected regions of the substrate to thereby alternately expose the selected regions of the substrate to the radical species and the precursor gas multiple times. A thin film of reaction product is formed in the selected regions of the substrate and not on undesired surfaces.

19 Claims, 17 Drawing Sheets

(56) References Cited

U.S. PATENT DOCUMENTS

2010/0215871 A1      8/2010  Lee

OTHER PUBLICATIONS

PCT Search History for PCT/US2024/027853, date of Search, Jul. 27, 2024, 3 pages.
PCT Written Opinion of the International Searching Authority, mailing date Aug. 5, 2024, 9 pages.

* cited by examiner

METHODS AND SYSTEMS FOR INHIBITING PRECURSOR INTERACTIONS DURING RADICAL-ENHANCED ATOMIC LAYER DEPOSITION

COPYRIGHT NOTICE

CROSS-REFERENCE TO RELATED APPLICATIONS

This application claims the benefit of U.S. Provisional Patent Application Ser. No. 63/500,521 filed May 5, 2023, titled "METHODS AND SYSTEMS FOR INHIBITING PRECURSOR INTERACTIONS DURING RADICAL-ENHANCED ATOMIC LAYER DEPOSITION," the entire contents of which are incorporated herein by reference.

TECHNICAL FIELD

This disclosure relates generally to manufacturing processes and in particular to methods and systems for inhibiting precursor interactions during radical-enhanced atomic layer deposition.

BACKGROUND

An overview of conventional ALD processes is provided in Atomic Layer Epitaxy (T. Suntola and M. Simpson, eds., Blackie and Son Ltd., Glasgow, 1990), which is incorporated herein by reference. Numerous patents and publications describe the use of radicals in connection with thin film deposition techniques, including atomic layer deposition (ALD) and sequential chemical vapor deposition. Many chemistries for radical-enhanced ALD (REALD) have been proposed, and many more are expected to be developed in view of the need for efficient production of high-quality thin films in semiconductor manufacturing and other industries.

Radicals (also sometimes called "free radicals") are unstable atomic or molecular species having an unpaired electron. For example, hydrogen gas exists principally in diatomic molecular form, but molecular hydrogen may be split into atomic hydrogen radicals each having an unpaired electron. Many other radical species are known. In embodiments described herein, the radicals produced and used in the thin film deposition process may include highly-reactive radical gas species formed of a single element such as hydrogen, nitrogen, oxygen (e.g. ozone), or chlorine, as well as compound radicals such as hydroxide (OH).

U.S. Pat. No. 8,187,679, titled "Radical-Enhanced Atomic Layer Deposition System and Method," incorporated herein by reference, described systems and methods for ALD in which oscillating, reciprocating, or circular movement of a substrate can be employed to accomplish ALD processes using precursor radicals that are continuously introduced into a reaction space by a steady-state radical source. The gaseous radical species is maintained in a radicals zone within the reaction chamber while a precursor gas is introduced into a precursor zone. The precursor zone is spaced apart from the radicals zone to define a radical deactivation zone therebetween.

A need exists for REALD methods and systems that allow precursor gas to be present throughout a reaction chamber.

BRIEF DESCRIPTION OF THE DRAWINGS

The embodiments disclosed herein will become more fully apparent from the following description and appended claims, taken in conjunction with the accompanying drawings. The drawings depict primarily generalized embodiments (and are not necessarily to scale), which embodiments will be described with additional specificity and detail in connection with the drawings in which:

FIG. 11A depicts the substrate in a left position. FIG. 11B depicts the substrate in a middle position. FIG. 11C depicts the substrate in a right position.

DETAILED DESCRIPTION

Figure 1:
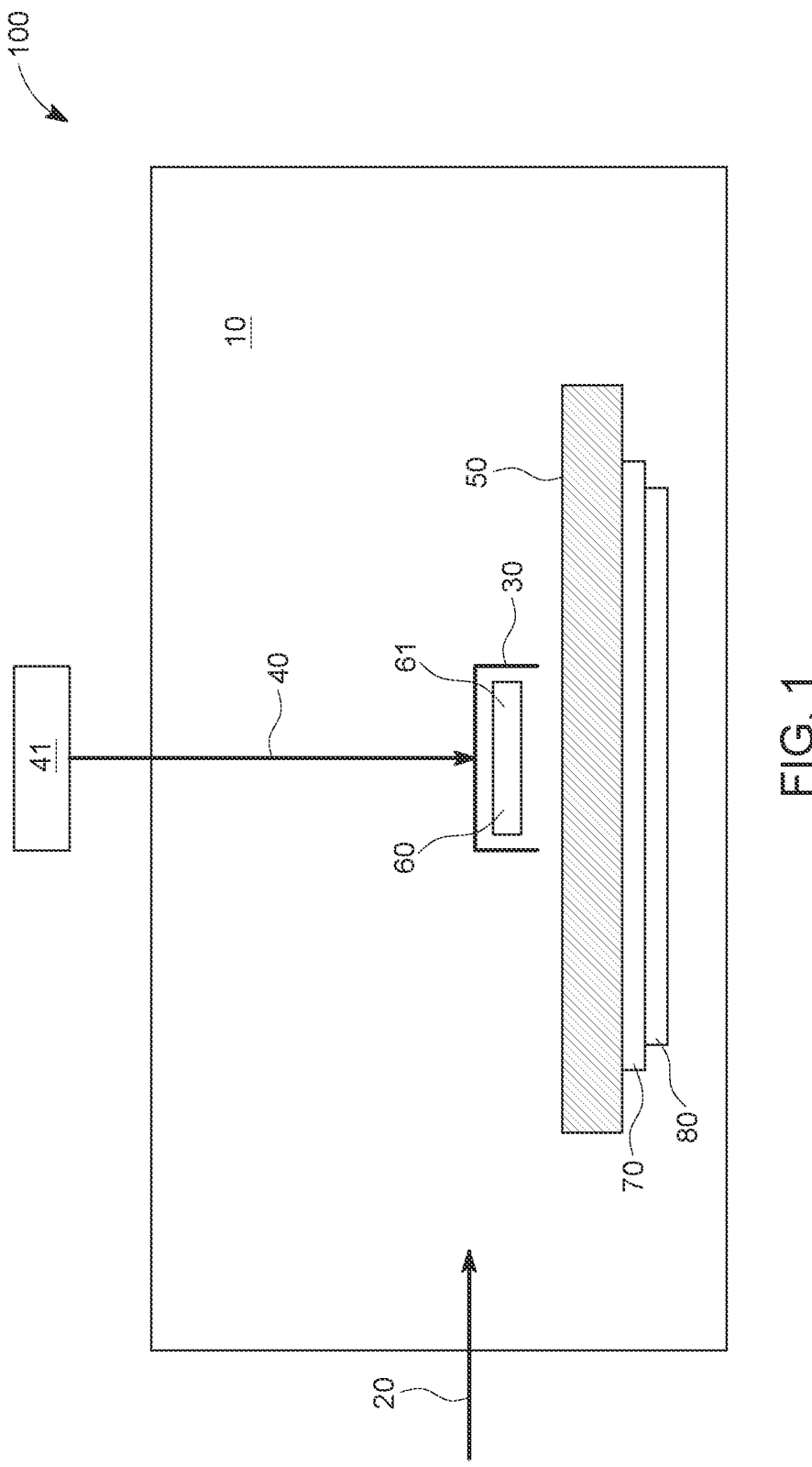
FIG. 1 illustrates a cross-sectional view of one embodiment of an exemplary system for inhibiting precursor interactions during radical-enhanced atomic layer deposition.

Disclosed herein are processes and systems for thin film deposition.

Atomic Layer Deposition (ALD) and chemical vapor deposition (CVD) can utilize the same precursors. However, in contrast to CVD, ALD involves a sequential exposure of a surface to the precursors. Additional steps, including purge steps, can occur in between precursor exposures, reducing the reaction byproducts trapped in the thin film of product produced by the chemical reactions.

Additionally, ALD provides conformal films, even in high-aspect ratio features. ALD reactions tend to coat any surface sequentially exposed to the precursors, including the walls of the reaction chamber and any other equipment present in the reaction chamber. Therefore, ALD has typically been performed in a reaction chamber separate from other processing equipment. This adds to the overall expense of a manufacturing process involving ALD.

Disclosed herein are methods and system for depositing thin films, where the ALD process can optionally be performed in the same chamber where other processes are performed. For example, utilizing the methods and systems disclosed herein, ALD can be performed in the same chamber as high-speed printing processes with a printhead. While not a requirement for using the embodiments disclosed herein, performing ALD in the same chamber as other process, could be advantageous.

Furthermore, the methods and systems disclosed herein can allow for reduced waste of precursor gases to achieve the same film thickness. While not a requirement for using the embodiments disclosed herein, reduced waste of unused precursor gases could be advantageous both economically and environmentally. Other advantages and benefits of the embodiments disclosed herein will become apparent as the embodiments are discussed in detail below.

In one embodiment, methods of depositing a thin film include providing a substrate to be coated and completely exposing the substrate to a precursor gas. Meanwhile, a gaseous radical species is directed through a shroud towards the substrate. The gaseous radical species flows through the shroud under sufficient flow and pressure conditions to substantially prevent the precursor gas from flowing into the shroud. Thus, the entire substrate, or even the entire chamber, may be exposed to the precursor gas; however, chemical reaction between the gaseous radical species and the precursor gas is limited to regions where the shroud has been. The shroud can be alternately positioned over selected regions of the substrate to thereby alternately expose the selected regions of the substrate to the radical species and the precursor gas multiple times. Some of the precursor gas will adsorb on the selected regions of the substrate as an adsorbed precursor. Each subsequent exposure of the selected regions of the substrate to the radical species results in some of the radicals converting at least a portion of the adsorbed precursor to a product in the selected regions. A thin film of the reaction product is formed in the selected regions of the substrate and not on undesired surfaces.

Less of the precursor gas may be used to create the thin film, than a comparable thin film made using the same reactants but in a spatial atomic layer deposition process or a pulse atomic layer deposition process. In particular, for a pulse ALD process, each reactant (i.e., precursor gas and gaseous radical species) may be separately pumped into a reaction chamber and then evacuated from the chamber before the next reactant is introduced. The embodiments disclosed herein advantageously potentially reduce both the time required for introducing the reactants and waste of the reactants, since both reactants can be present at the same time but reaction is controlled by the location of the shroud relative to the substrate.

The gaseous radical species is preferably unstable and readily recombines or otherwise deactivates as it exits the shroud. This minimizes reaction of the gaseous radical species with the precursor gas in locations outside the shroud. Therefore, even though the precursor gas is widely dispersed and a monolayer of the precursor gas may adsorb to the entire substrate and chamber surfaces, a thin film of the reaction product only forms in regions of the substrate where the shroud is present (which could be the entire substrate, selected portions of the substrate, or even building up more of the thin film on certain portions of the substrate).

A number of methods may be used to cause recombination or otherwise deactivate gaseous radical species that did not react with adsorbed precursor. For example, by way of a non-limiting example, the gaseous radical species may be provided under sufficient flow and pressure conditions such that the residence time of the gaseous radical species in the shroud allows for substantial recombination or deactivation of the gaseous radical species prior to the gaseous radical species exiting the shroud. Substantial recombination or deactivation of the gaseous radical species prior to the gaseous radical species exiting the shroud results in reaction between the gaseous radical species and the precursor gas occurring predominantly in the selected regions. Reaction product growth outside the selected regions can be used to measure the efficacy of recombination or deactivation of the gaseous radical species provided by the shroud. Preferably, reaction product growth outside the selected regions is limited.

The method disclosed herein may include engaging a radical deactivation device at the perimeter of the shroud to aid recombining or otherwise deactivating the gaseous radical species prior to the gaseous radical species exiting the shroud. A non-limiting example of one possible radical deactivation device includes a deactivating surface located proximal to the exposed surface of the substrate and located along a perimeter of the shroud. In this example, the shroud is configured to direct the gaseous radical species between the exposed surface of the substrate and the deactivating surface as the gaseous radical species exits the shroud. The deactivating surface may not directly promote deactivation of the radical species, but may be sized (in conjunction with the flow rates, pressure differentials in the chamber, and the mean free path of the gaseous radical species) to allow time for substantial recombination or other deactivation of radicals present in the gaseous radical species, prior to the gaseous radical species interacting with the precursor gas present in the reaction chamber. The deactivating surface may be configured to generate laminar flow of the gaseous radical species between the deactivating surface and the exposed surface of the substrate. Alternatively or additionally, the deactivating surface may be configured to generate turbulent flow of the gaseous radical species in some or all regions of the deactivating surface. Micro-baffles, grooves, or other structures in or on the deactivating surface could be used to introduce turbulent flow, increase the flow path, or both.

In addition to or an alternative to the deactivating surface, the radical deactivation device may include radical deactivation devices known in the art, such as a getter, a catalyst, a charged electrode, and combinations thereof. These other radical deactivation devices may be integrated into the deactivation surface or may be separate from or an alternative to the deactivation surface.

The gaseous radical species may be generated in-situ by applying energy to a secondary gas introduced to the shroud. The gaseous radical species is preferably generated in-situ by igniting a plasma from the secondary gas within the shroud, such as by a DC generator. Alternatively, high-intensity light may be applied to the secondary gas while within the shroud to generate the gaseous radical species. The gaseous radical species may also be generated remotely and injected into the shroud.

The secondary gas used to generate the gaseous radical species may be an oxygen-containing gas, a nitrogen-containing gas, a hydrogen-containing gas, or combinations thereof, depending on the desired radical species for the reaction. For example, the secondary gas may be air, $O_2$, CO, $CO_2$, NO, $N_2O$, $NO_2$, $N_2$, $NH_3$, $N_2$:$H_2$, $H_2$, and mixtures of the foregoing.

A variety of precursor gases may be used. For example, by way of non-limiting example, the precursor gas may comprise an amino-based silicon precursor, such as an amino-based silicon precursor that includes at least one nitrogen atom directly bonded to a silicon atom. Non-limiting examples of amino-based silicon precursors include bis-diethylaminosilane (BDEAS), ORTHRUS, tris-diethylaminosilane (TDMAS or 3DMAS), bis-tert-butylaminosilane (BTBAS), Diisopropylaminosilane (DIPAS), bis-diisopropylaminodisilane (BDIPADS), Trisilylamine (TSA), neopentasilane, N (SiH)3)3Tris (isopropylamino) silane (TIPAS), bis (ethylmethyl aminosilane) (BEMAS) and diisopropylamino trichlorosilane (DIPATCS).

In the methods disclosed herein, completely exposing the substrate to the precursor gas may include providing a reaction chamber; and pressurizing the reaction chamber, at least partially, with a single dose of the precursor gas or continuously pumping the precursor gas into the reaction chamber. The methods may include first evacuating the reaction chamber to 0.000001 Torr to 100 Torr prior to pressurizing the reaction chamber. The reaction chamber may be pressurized to pressures ranging from 10 Torr to atmospheric pressure with the precursor gas, a secondary gas, additional gases, or mixtures thereof.

The geometry of the substrate is not limited. The substrate may be a curved surface, a flat surface, or a roll-to-roll film.

Alternately positioning the shroud over selected regions of the substrate may include moving the substrate, moving the shroud, or both. For example, alternately positioning the shroud over selected regions of the substrate may involve moving the shroud in a x-y plane above the substrate.

In certain embodiments, it will be beneficial to move the substrate relative to the shroud, rather than moving the shroud.

Turning now to systems for depositing thin films on substrates, FIG. 1 illustrates a cross-sectional view of one embodiment of an exemplary system 100. The system includes a reaction chamber 10, including an inlet 20 for introducing a precursor gas into the reaction chamber 10. A shroud 30 is located within the reaction chamber 10. The shroud 30 is operably coupled to a secondary gas supply system 40. The shroud 30 is configured to direct a secondary gas towards a substrate 50, when the substrate 50 is present in the reaction chamber 10. A radical generator 60 is operably coupled to the shroud 30. The radical generator 60 is configured to generate a gaseous radical species from the secondary gas, when the secondary gas is present and flowing.

The system 100 includes a pump 41 for pumping a continuous flow of the secondary gas through the shroud 30 at sufficient flow and pressure conditions to substantially prevent the precursor gas from flowing into the shroud 30, during operation. In some embodiments, the pump 41 may not be present.

The system 100 includes a positioning system 70 configured to alternately position the shroud 30 over selected regions of the substrate 50 (either by moving the shroud 30 or the substrate 50, or combinations of moving both), when the substrate 50 is present in the reaction chamber 10. Alternately exposing selected regions of the substrate 50 to the gaseous radical species and the precursor gas multiple times, each exposure to the precursor gas resulting in some of the precursor gas adsorbing on the selected regions of the substrate 50 as an adsorbed precursor. Likewise, each subsequent exposure of the selected regions of the substrate 50 to the gaseous radical species results in some of the radicals converting at least a portion of the adsorbed precursor to a product in the selected regions, whereby a thin film is formed in the selected regions of the substrate 50.

In FIG. 1, the positioning system 70 is shown operably connected to the substrate 50. Alternatively, the positioning system 70 may be operably connected to the shroud 30.

FIG. 1 further illustrates a carriage 80. The carriage 80 is configured to advance the substrate 50 through the reaction chamber 10. In FIG. 1, the positioning system 70 and the carriage 80 work together to position the substrate 50 relative to the shroud 30. The positioning system 70 is configured to move the substrate 50 in an x-y plane below the shroud 30 and transverse to the movements of the carriage 80. The carriage 80 moves the substrate 50 forward and reverse in the z direction.

For cylindrical systems, the carriage 80 may be configured to rotate axially a cylindrical substrate holder. For radial systems, the carriage 80 may be configured to rotate radially a circular substrate holder. For linear systems, the carriage 80 may be configured to move linearly a rectangular substrate. Likewise, for roll-to-roll systems, the carriage 80 may be configured to advance/rewind a thin film substrate.

In certain embodiments, the carriage 80 may not be present and all movements of the substrate are performed by the positioning system 70.

In FIG. 1, the radical generator 60 is located within the reaction chamber 10; however, the radical generator 60 could also be located elsewhere, including outside the reaction chamber 10, and the gaseous radical species produced thereby directed via the secondary gas supply into the shroud 30 and towards the substrate 50. For example, the radical generator 60 may be located in a flow path of the secondary gas upstream of the shroud 30.

The radical generator 60 preferably comprises a plasma generator. For example, the radical generator 60 may comprise an electrode 61 and the shroud 30 may be the corresponding ground, whereby a plasma is formed between electrode 61 and the shroud 30 as electrical energy is applied to the electrode. When the radical generator 60 includes an electrode 61, the substrate proximal surface of the electrode is preferably configured to be in close proximity to the exposed surface of the substrate 50. In such embodiments, the shroud 30 preferably comprises a housing sized and configured to surround the electrode 61 on all sides other than the substrate proximal surface. With this configuration, when the secondary gas is present and flowing within the shroud 30, the shroud directs the secondary gas between the substrate proximal surface of the electrode 61 and an exposed surface of the substrate.

In other embodiments, the radical generator 60 may be a UV light source or other high-intensity light source.

FIGS. 2A-9 illustrate non-limiting examples of different shroud 30 and radical generator 60 configurations. In each of the different shroud 30 configurations a radical deactivation device is present. Consistent numbering is used in each of the examples to reference similar elements between the examples. In each example, the radical deactivation device comprises a deactivating surface located proximal to the exposed surface of the substrate 50 and located along a perimeter of the respective shroud 30. In each example, the respective shroud 30 is configured to direct the gaseous radical species between the exposed surface of the substrate 50 and the deactivating surface as the gaseous radical species exits the respective shroud 30. The deactivating surface is sized to allow time for substantial recombination or other deactivation of radicals present in the gaseous radical species, prior to the gaseous radical species interacting with the precursor gas present in the reaction chamber (not shown in FIGS. 2A-9).

Figures 2A, 2B:
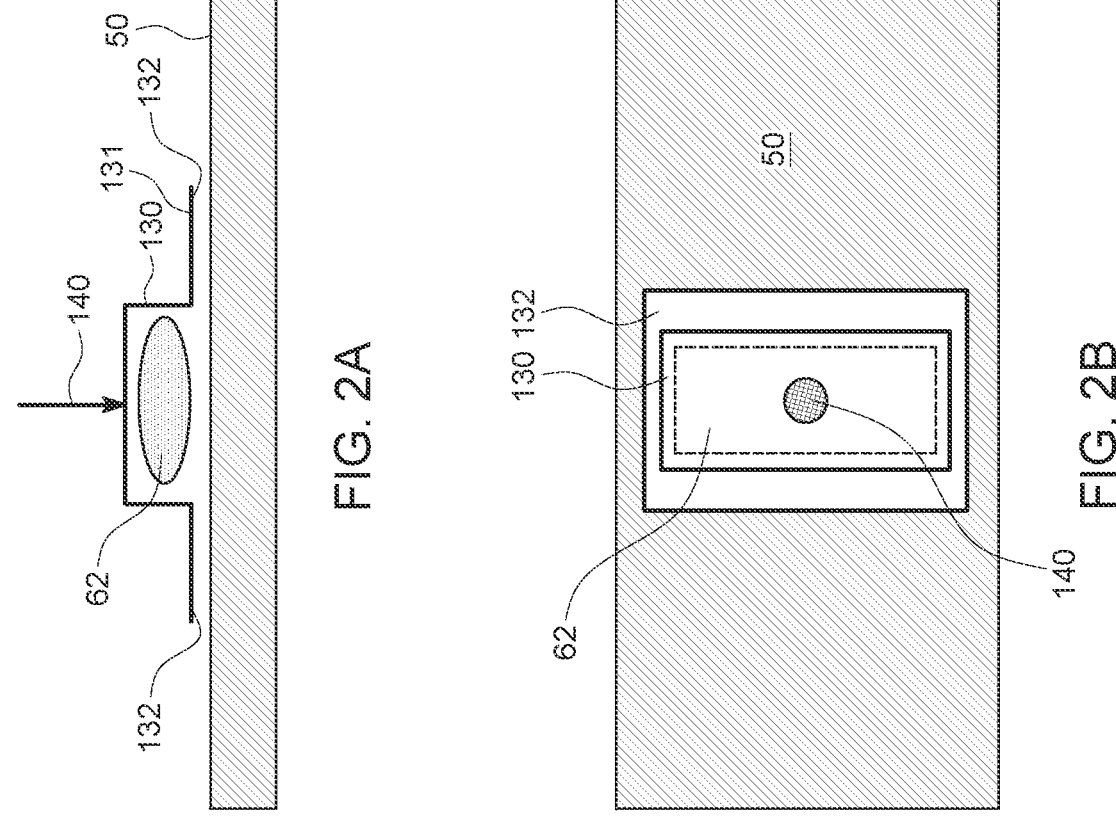
FIG. 2A illustrates a cross-sectional view of one embodiment of an exemplary shroud according to the methods and systems disclosed herein.
FIG. 2B illustrates a plan view of the shroud of FIG. 2A.

FIG. 2A illustrates a cross-sectional view of one embodiment of an exemplary shroud 130. The shroud 130 includes radical deactivation device 131 and deactivating surface 132. Plasma 62 is shown (generated by radical generator 60—not shown). The secondary gas supply system 140 connects at the center of the shroud 130.

FIG. 2B illustrates a plan view of the shroud 130. The radical deactivation device 131 and deactivating surface 132 surround the perimeter of the shroud 130 like the brim of a rectangular top hat. In the shroud 130, the deactivating surface 132 does not uniformly extend around the perimeter of the shroud 130. The illustrated geometry of the shroud 130 is exemplary. The dimensions of the shroud 130 and the deactivating surface 132 can be adapted to the dimensions of the substrate 50.

The secondary gas is directed between the radical generator 60 (not shown) and the inside of the shroud 130. Gaseous radical species generated by the plasma 62 in the secondary gas flow towards the exposed surface of the substrate 50 and react with an adsorbed precursor gas molecules present on the exposed surface of the substrate 50. As the secondary gas and gaseous radical species flow outward and towards the perimeter of the shroud 130, the gaseous radical species continue to react with adsorbed precursor gas molecules present on the exposed surface of the substrate 50. The pressure and flow rate of the secondary gas supply can be regulated to prevent precursor gas molecules from flowing into the shroud 130 and coming into contact with the plasma 62 (e.g., pressure within the shroud 131 is higher than pressure within the rest of the reaction chamber. Meanwhile, as the gaseous radical species travel away from the plasma, the radical species recombine into inactive molecules or otherwise deactivate. The dimension of the deactivating surface 132 may be selected to optimize deactivation of the gaseous radical species prior to the secondary gas exiting the gap between the deactivating surface 132 and the exposed surface of the substrate 50.

Figures 3A, 3B:
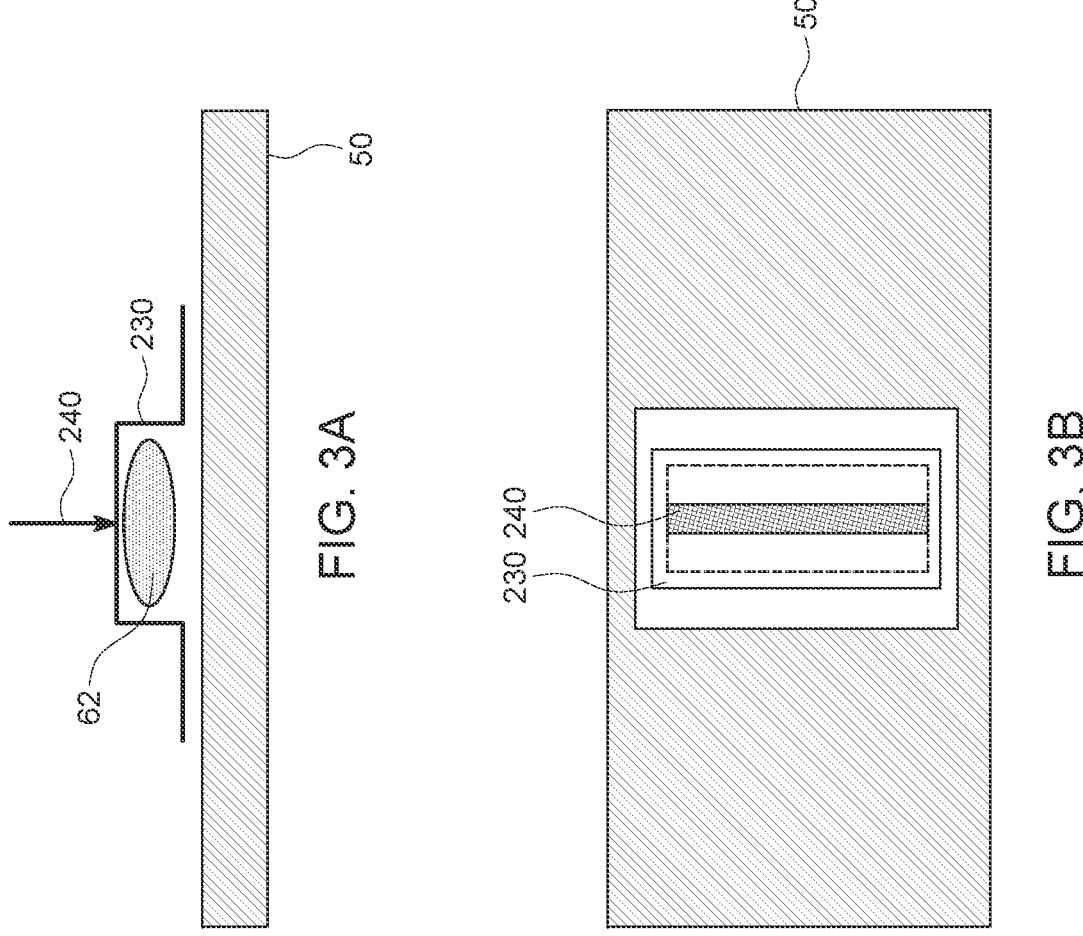
FIG. 3A illustrates a cross-sectional view of one embodiment of an exemplary shroud according to the methods and systems disclosed herein.
FIG. 3B illustrates a plan view of the shroud of FIG. 3A.

FIG. 3A illustrates a cross-sectional view of a shroud 230. The shroud 230 is similar to the shroud 130; however, the secondary gas supply system 240 connects along the length of the shroud 230, such as via slots or a manifold. The secondary gas enters along the length of the shroud 230 and along the length of the plasma 62.

FIG. 3B illustrates a plan view of the shroud 230. As with the shroud 130, the illustrated geometry of the shroud 230 is exemplary.

Figures 4A, 4B:
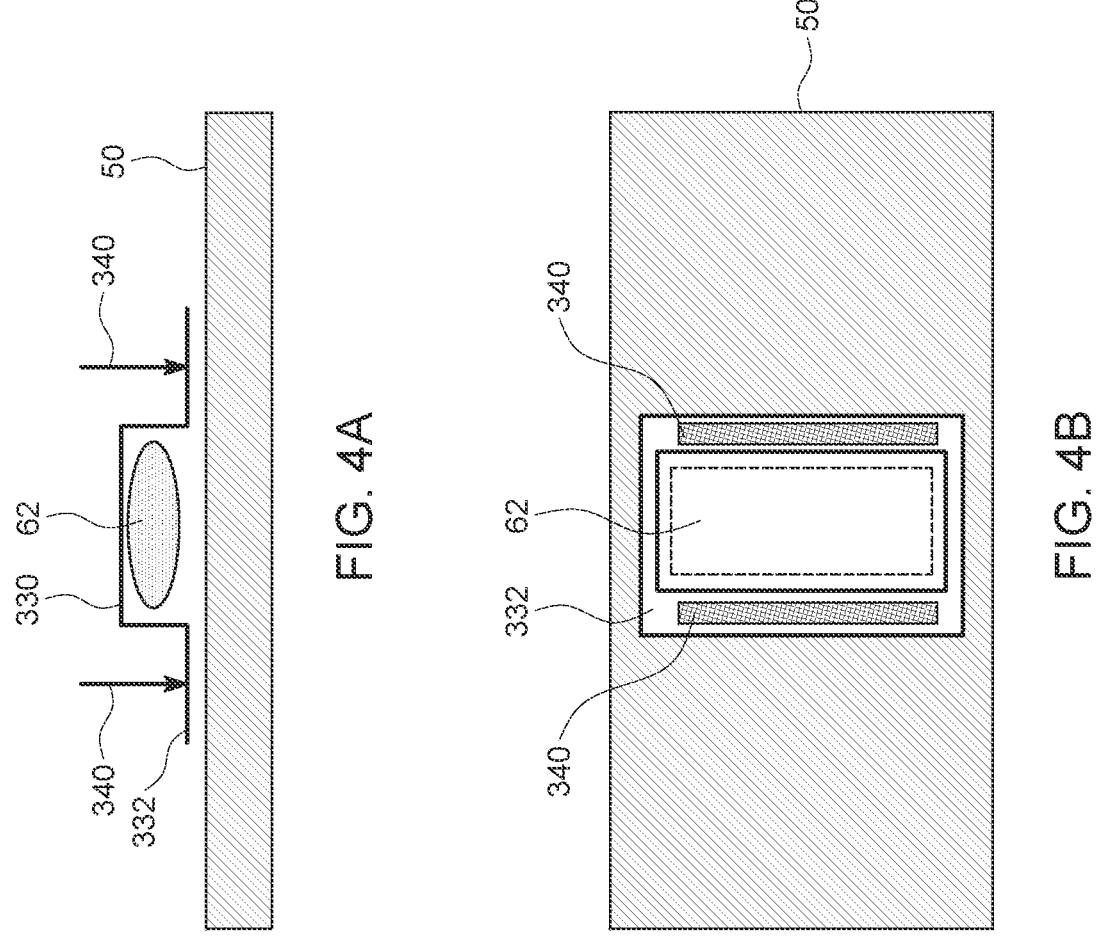
FIG. 4A illustrates a cross-sectional view of one embodiment of an exemplary shroud according to the methods and systems disclosed herein.
FIG. 4B illustrates a plan view of the shroud of FIG. 4A.

FIG. 4A illustrates a cross-sectional view of a shroud 330. The shroud 330 is similar to the shroud 130; however, the secondary gas supply system 340 connects along the deactivating surface 332, via lengthwise slots. The secondary gas enters along the length of the shroud 330. In this embodiment, the secondary gas is primarily only radicalized when between the plasma 62 and the exposed surface of the substrate 50.

FIG. 4B illustrates a plan view of the shroud 330. As with the shroud 130, the illustrated geometry of the shroud 330 is exemplary.

Figures 5A, 5B:
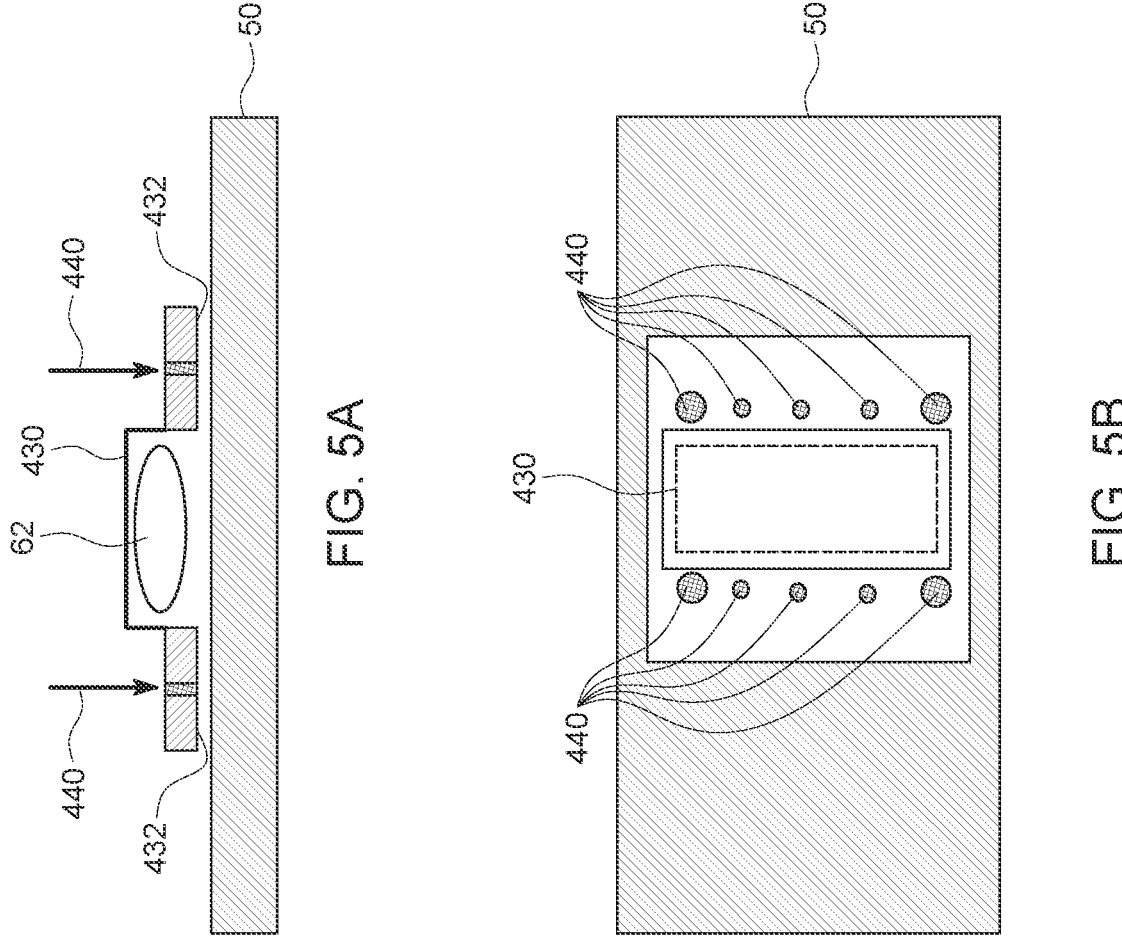
FIG. 5A illustrates a cross-sectional view of one embodiment of an exemplary shroud according to the methods and systems disclosed herein.
FIG. 5B illustrates a plan view of the shroud of FIG. 5A.

FIG. 5A illustrates a cross-sectional view of a shroud 430. The shroud 430 is similar to the shroud 330. The secondary gas supply system 440 connects along the deactivating surface 432 via a manifold. The secondary gas enters along the length of the shroud 430 at various ports. The ports can be sized based on the geometry of the substrate. In this embodiment, the secondary gas is primarily only radicalized when between the plasma 62 and the exposed surface of the substrate 50.

FIG. 5B illustrates a plan view of the shroud 430. As with the shroud 130, the illustrated geometry of the shroud 430 is exemplary.

Figure 6A:
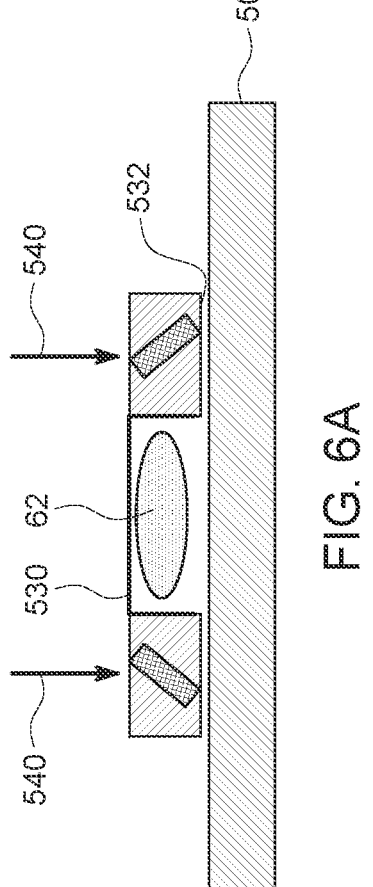
FIG. 6A illustrates a cross-sectional view of one embodiment of an exemplary shroud according to the methods and systems disclosed herein.

FIG. 6A illustrates a cross-sectional view of a shroud 530. The shroud 530 is similar to the shroud 330 and the shroud 430. The secondary gas supply system 540 connects along the deactivating surface 532 via a manifold. The secondary gas enters along the length of the shroud 430 at various ports. The slits or ports can be oriented to direct the secondary gas away from the shroud 530, further preventing migration of the precursor gas near the plasma 62.

Figure 6B:
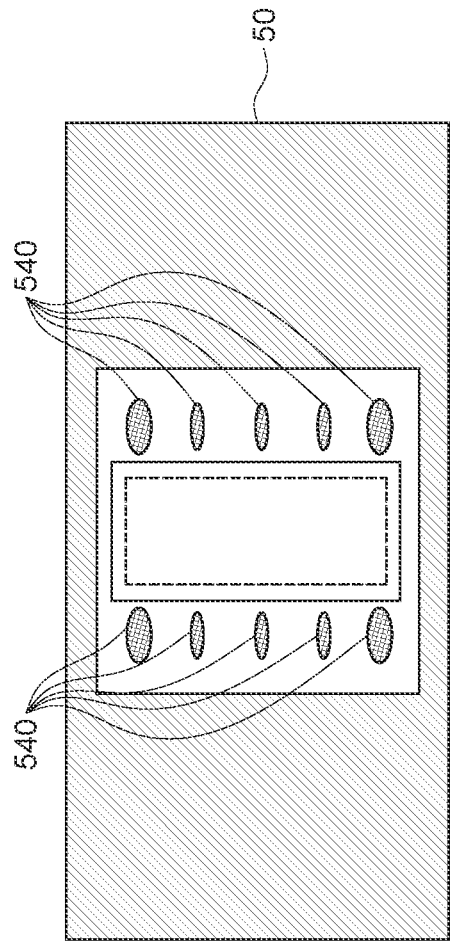
FIG. 6B illustrates a plan view of the shroud of FIG. 6A.

FIG. 6B illustrates a plan view of the shroud 530. As with the shroud 130, the illustrated geometry of the shroud 530 is exemplary.

Figure 7:
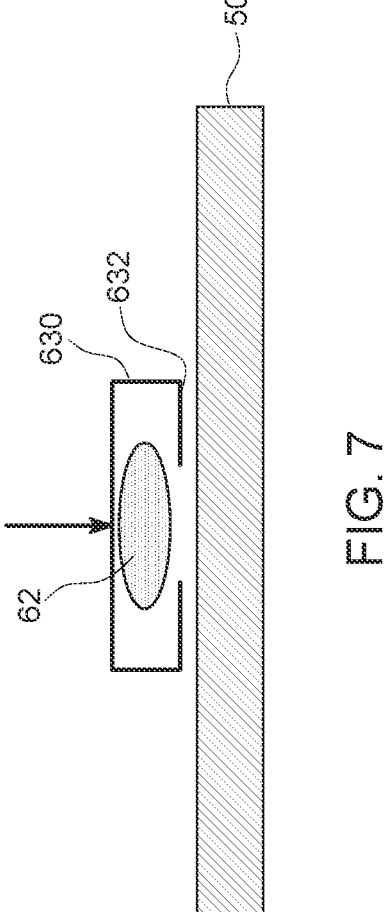
FIG. 7 illustrates a cross-sectional view of one embodiment of an exemplary shroud according to the methods and systems disclosed herein.

FIG. 7 illustrates a cross-sectional view of a shroud 630. The shroud 630 is similar to the shroud 130, except the deactivating surface 132 is "folded under" the shroud 630. This creates a "window" for plasma exposure at the underside of the shroud 630. This window can be sized as needed to limit interactions between the plasma 62 and the exposed surface of the substrate 50.

Figure 8:
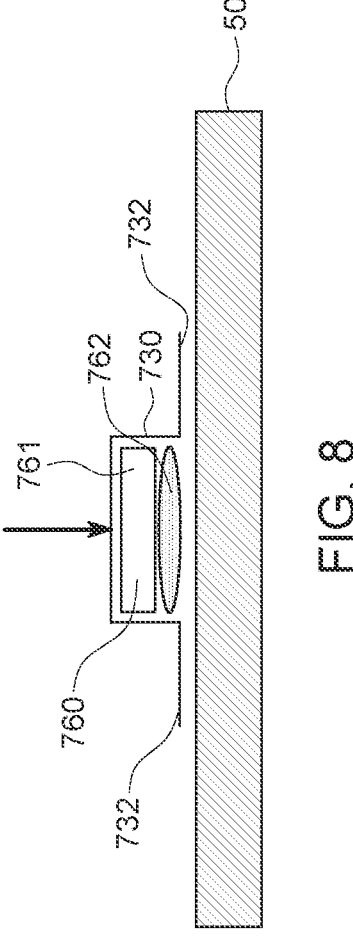
FIG. 8 illustrates a cross-sectional view of one embodiment of an exemplary shroud and electrode according to the methods and systems disclosed herein.

FIG. 8 illustrates a cross-sectional view of a shroud 730. The shroud 730 is similar to the shroud 130, except the electrode 761 of the plasma generator 760 is close enough to the interior surface of the shroud 730 that a plasma cannot ignite. The secondary gas flows through the narrow gaps and the plasma 762 only forms between the electrode 761 and the exposed surface of the substrate 50. In this example, the shroud 730 is grounded. The shroud 730 could be modified to include secondary gas slits along the length of the deactivating surface 732, either in addition to the central secondary gas supply system port or as a replacement for the central port.

Figure 9:
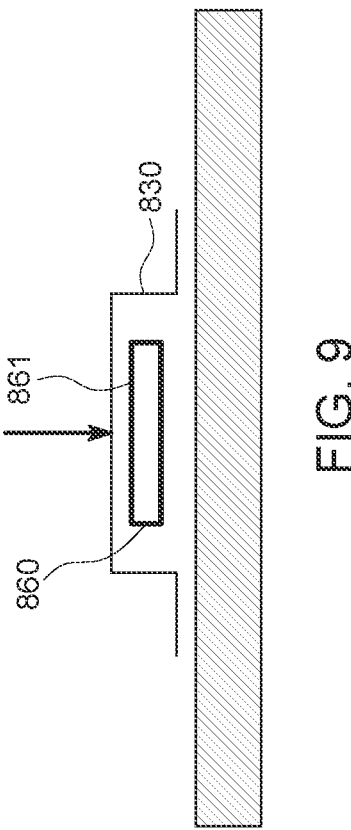
FIG. 9 illustrates a cross-sectional view of one embodiment of an exemplary shroud and electrode according to the methods and systems disclosed herein.

FIG. 9 illustrates a cross-sectional view of a shroud 830. The shroud 830 can be any of the shrouds disclosed herein. The electrode 861 of the plasma generator 860 is tubular and fabricated from square, rectangular, or rounded hollow tubing. The hollow interior of the tubular electrode 861 can allow for liquid cooling.

One of skill in the art will understand that many features of the various exemplary shrouds and systems disclosed herein can be combined or interchanged. Likewise, the various electrode configurations disclosed herein can be utilized with the different shrouds disclosed herein. The exemplary shrouds may be combined in arrays and oriented to coat one or both sides of a substrate.

Figure 10:
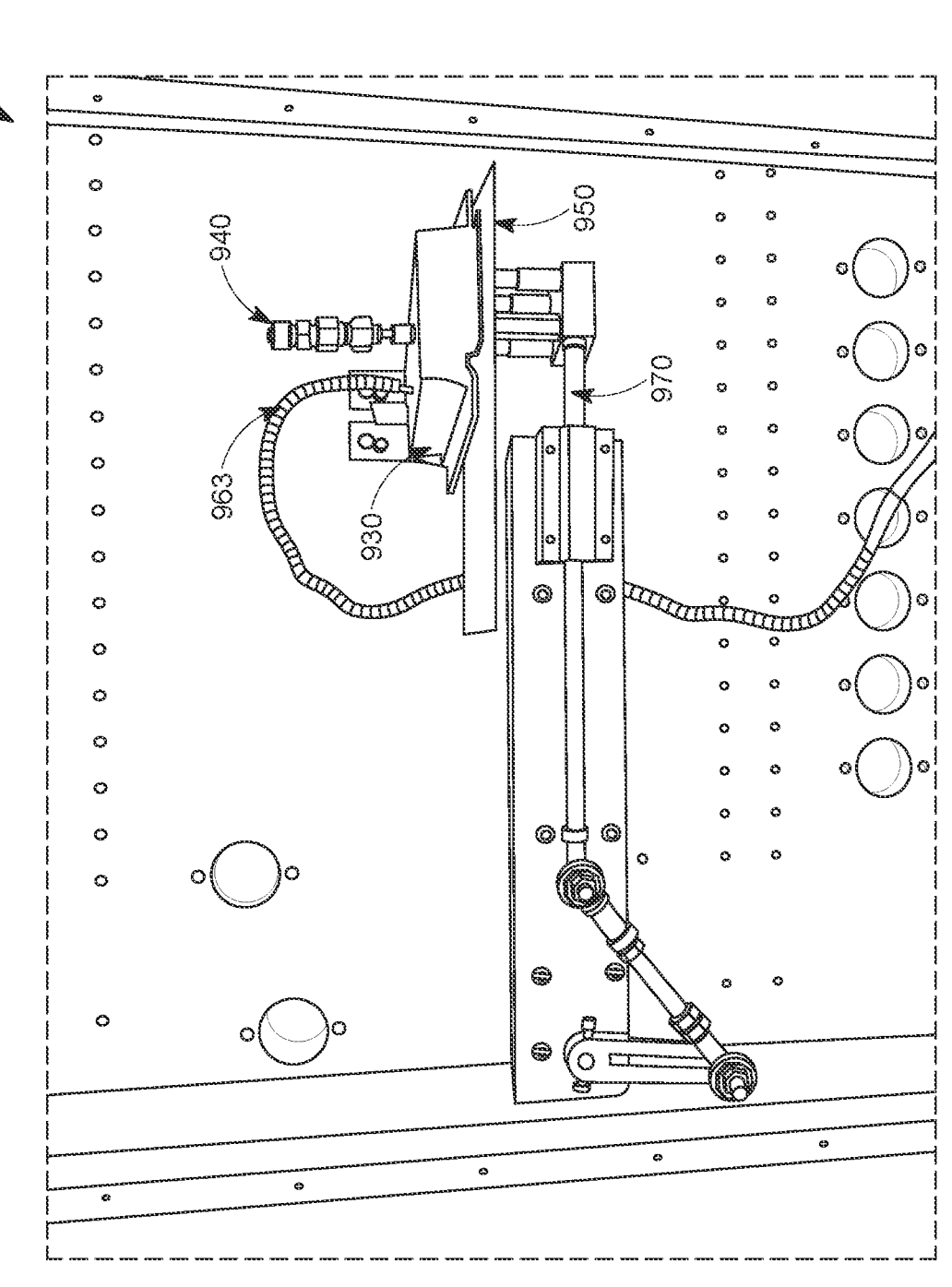
FIG. 10 depicts an exemplary prototype system according to one embodiment of the methods and systems disclosed herein.
Figures 11A, 11B, 11C:
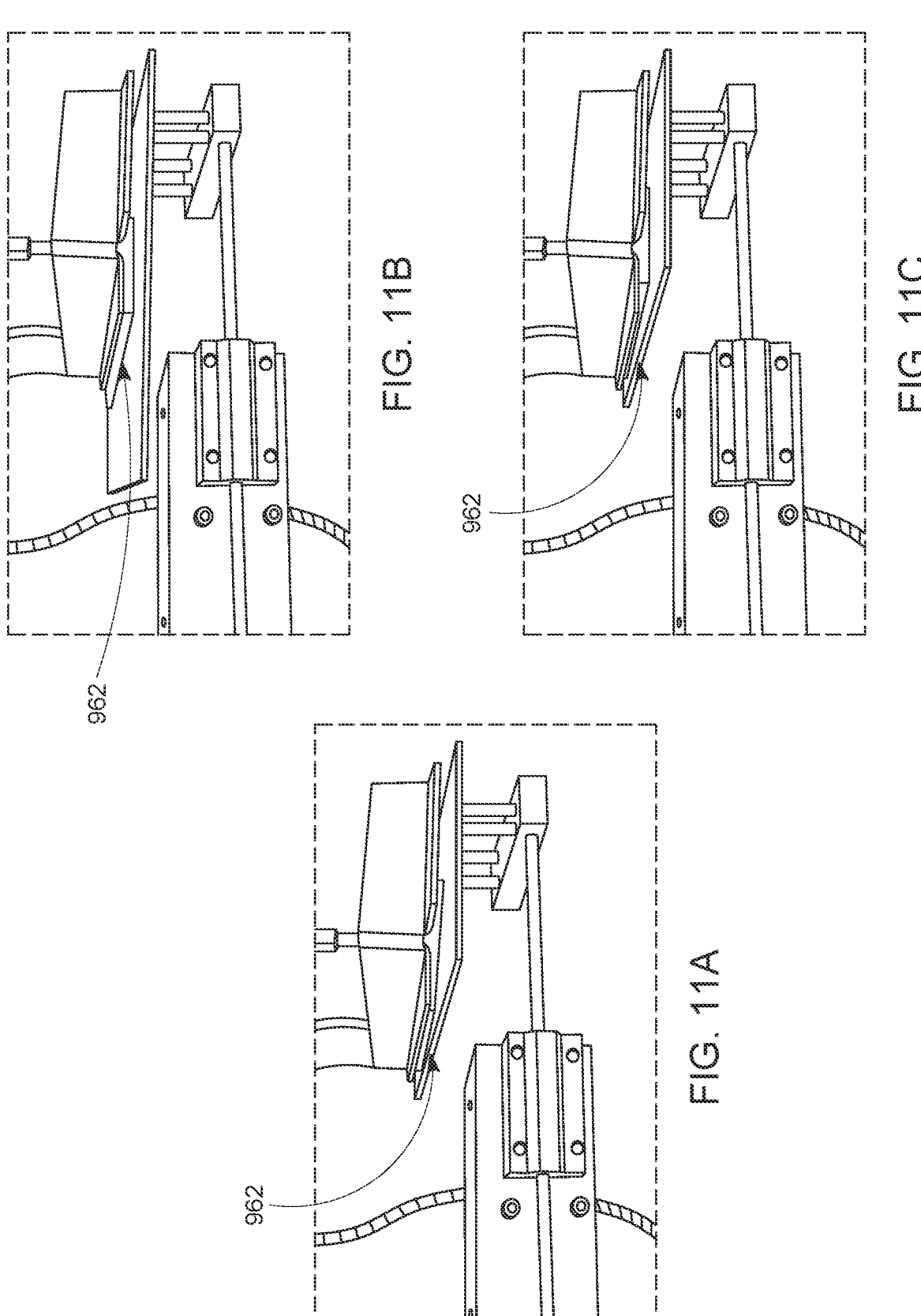
FIGS. 11A-11C are still shots of the exemplary prototype system of FIG. 10 in operation as the substrate shuttles side-to-side.

FIG. 10 depicts a prototype system 1000 with hand-made shroud 930. Secondary gas supply system 940 connection, electrical power supply 963, and positioning system 970 are visible. FIGS. 11A-11C are still shots of the prototype system 1000 in operation as the substrate 950 shuttles side-to-side. The glow of the plasma 962 is visible.

A number of different reaction chamber configurations are possible utilizing the methods and systems disclosed herein. Several exemplary configurations are illustrated in FIGS. 12-17.

Figure 12:
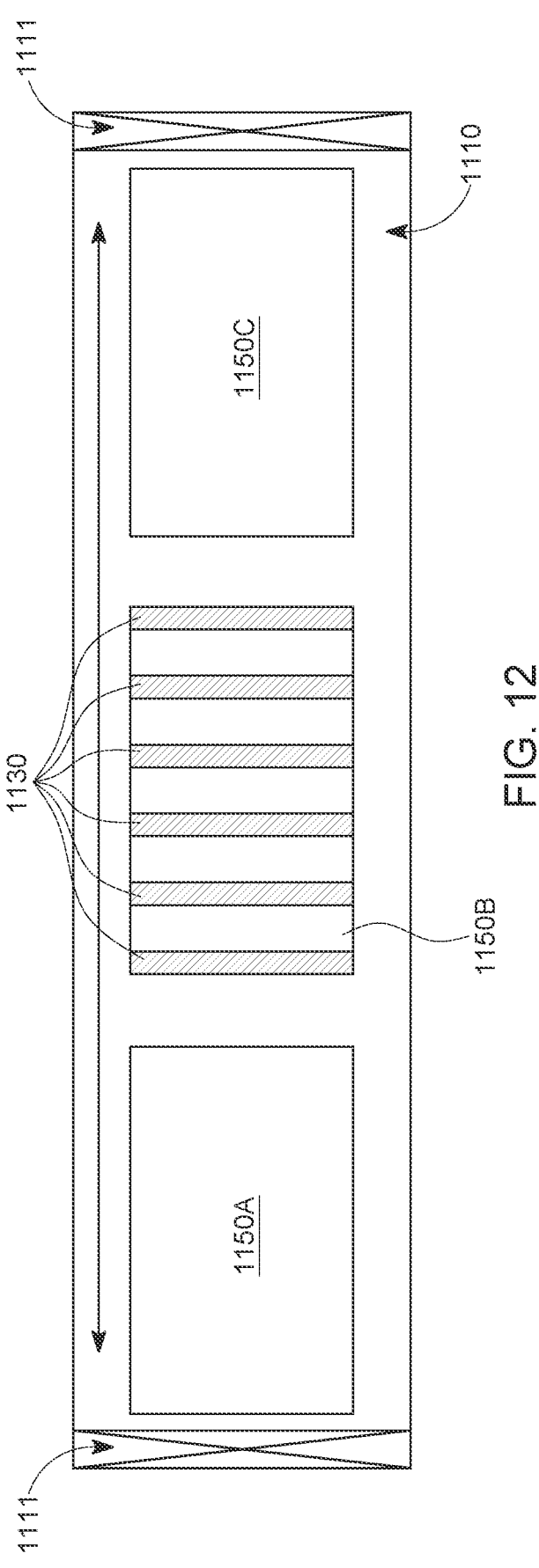
FIG. 12 illustrates an exemplary linear system with one embodiment of a reaction chamber according to the methods and systems disclosed herein.
Figure 13:
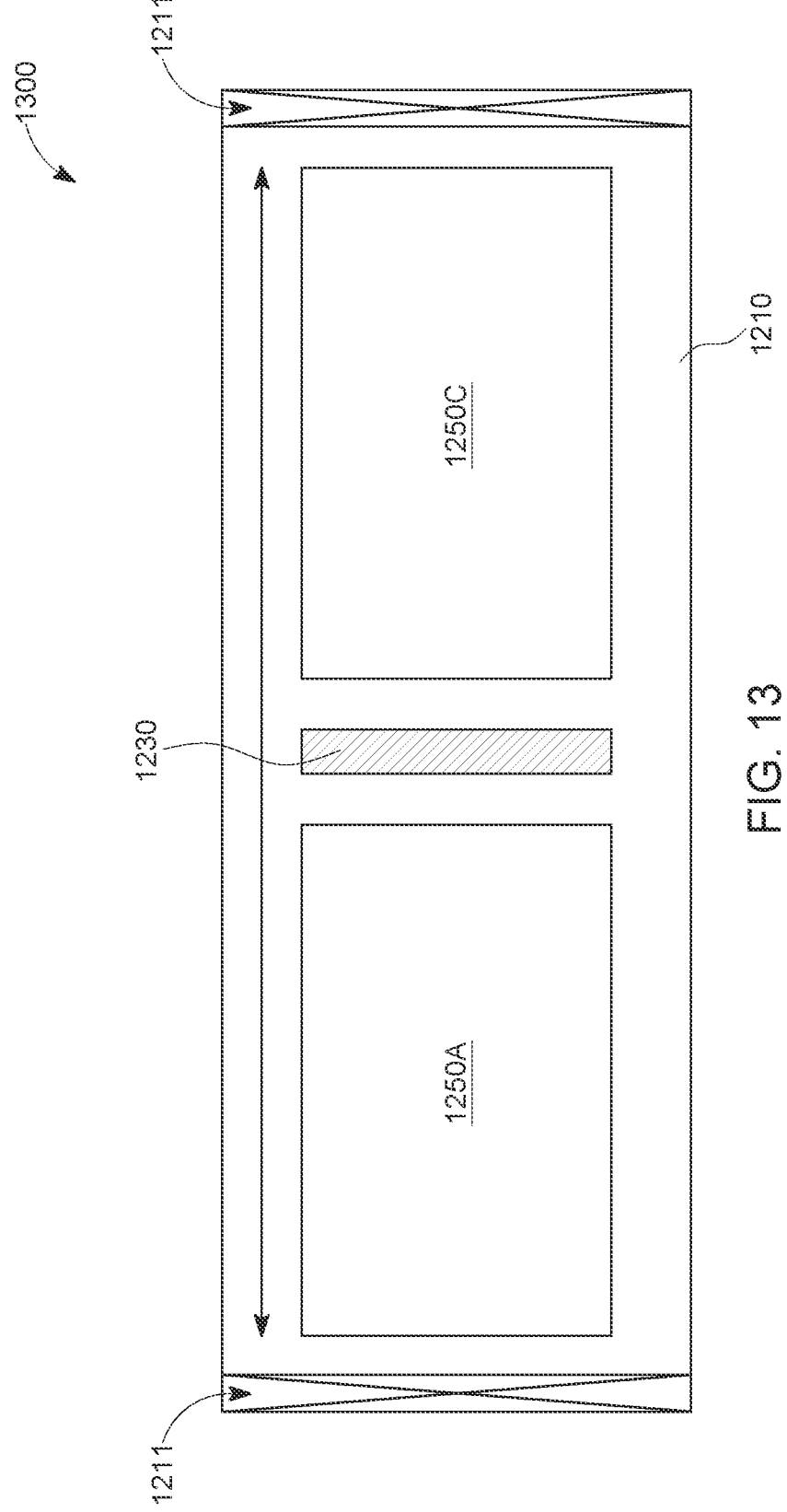
FIG. 13 illustrates an exemplary linear system with another embodiment of a reaction chamber according to the methods and systems disclosed herein.
Figure 14:
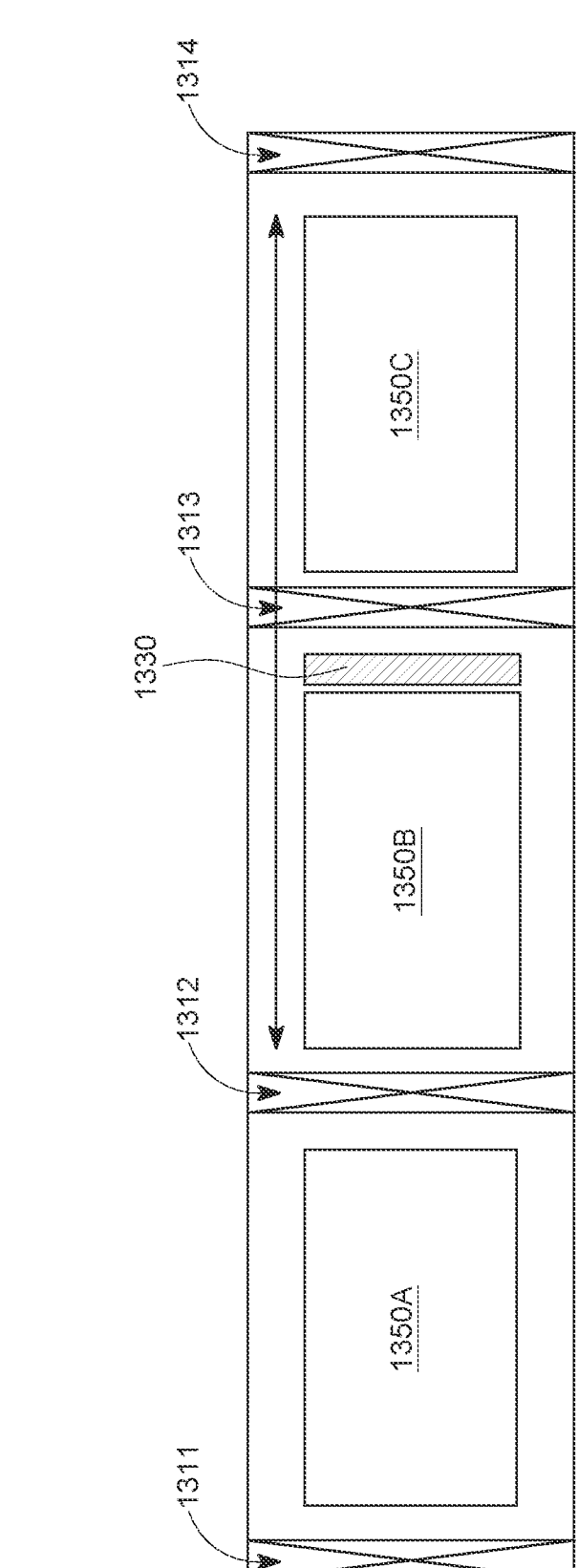
FIG. 14 illustrates an exemplary linear system with another embodiment of a reaction chamber according to the methods and systems disclosed herein.

FIGS. 12-14 depict exemplary linear processing reactor configurations. FIG. 12 illustrates an exemplary system 1200 with a linear reaction chamber 1110. The linear reaction chamber 1110 is able to operate without load locks. An array of shrouds 1130 (depicted as rectangles for simplicity) and corresponding electrodes (not shown) are placed centrally along the shuttle path of the substrate (position 1150B). A single substrate (not shown) is loaded into the starting position 1150A, the valves 1111 are closed, and the reaction chamber 1110 is pumped down to a desired pressure. Precursor gas is then pumped into the reaction chamber 1110 until a desired pressure or partial pressure is achieved. The electrodes are energized and the secondary gas is supplied to the array of shrouds 1130. The substrate is shuttled from the starting position 1150A to the overrun position 1150C and back to the starting position 1150A. The precursor gas fills the reaction chamber 1110 and is present in between each of the shrouds 1130. Therefore, complete ALD reactions equal to the number of shrouds 1130 in the array occur each time the substrate passes underneath the array of shrouds 1130. In this example, six complete ALD reactions occur on the entire surface of the substrate each time the substrate fully passes the array. The substrate can be shuttled back-and-forth non-stop until a desired thin film growth is achieved. The longitudinal length of the reaction chamber is roughly equivalent to three times the length of the substrate.

FIG. 13 illustrates an exemplary system 1300 with a linear reaction chamber 1210. The linear reaction chamber 1210 is similar to the reaction chamber 1110 and is able to operate without load locks. Reaction chamber 1210 only has a single shroud 1230. Operation is the same as for system 1200. As the substrate (not shown) shuttles back-and-forth from starting position 1250A and overrun position 1250C, a single complete ALD occurs. The longitudinal length of the reaction chamber is roughly equivalent to two times the length of the substrate, plus the width of the shroud 1230.

FIG. 14 illustrates a variation of the systems 1200 and 1300, but with load locks. Exemplary system 1400 can handle two different substrates. While a first substrate (not shown) is processing, with valve 1312 closed, valve 1311 opens and a second substrate (not shown) is moved into preparatory position 1350A. Valve 3111 closes, this chamber pumps down, and heats the second substrate. Meanwhile, the first substrate shuttles back-and-forth from positions 1350B and 1350C with valves 1312 and valves 1314 closed and valve 1313 open. The number of complete ALD performed per pass of the first substrate depends on the number of shrouds 1330 present. Once the first substrate is fully coated with the desired product thin film and in overrun position 1350C, then valve 1313 is closed, valve 1314 is opened and the first substrate leaves the chamber. While valve 1313 is closed, the second substrate can be moved to the start position 1350B. Valve 1314 is then closed, valve 1313 is opened, valve 1312 is closed and the processing of the second substrate begins.

Figure 15:
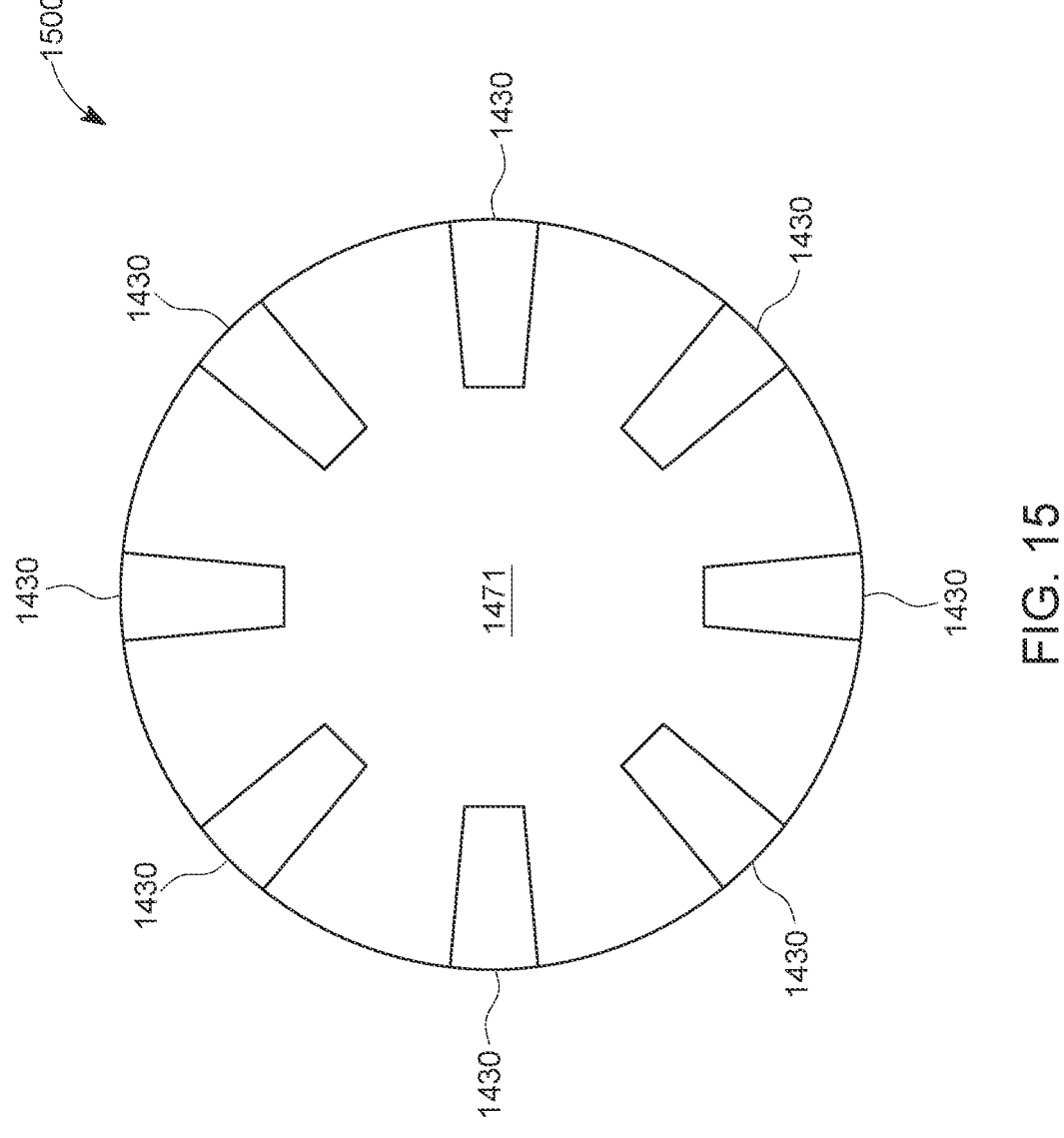
FIG. 15 illustrates an exemplary rotary system with one embodiment of a rotary platen according to the methods and systems disclosed herein.

FIG. 15 illustrates an exemplary rotary system 1500. The system 1500 includes a disc-shaped platen or carrier 1471 that rotates about a central axis and is the positioning system. Substrates (not shown), such as disc-shaped silicon wafers, can be mounted on the surface of the platen 1471. Substrates of other types and shapes may also be utilized. The platen 1471 spins about its axis within a reaction chamber (not shown). The substrates are transported along a circular transport path sequentially passing beneath each of the shrouds 1430. Each full revolution results in eight complete ALD cycles, since there are eight shrouds 1430 in the illustrated embodiment. Unlike the processes and systems disclosed in U.S. Pat. No. 8,187,679 that is divided into several sub-chambers or zones, in the system 1500 the precursor gas is present throughout the reaction chamber. In the system 1500, the precursor gas is prevented from reaching the plasma by the secondary gas flowing through each of the shrouds 1430.

Figure 16:
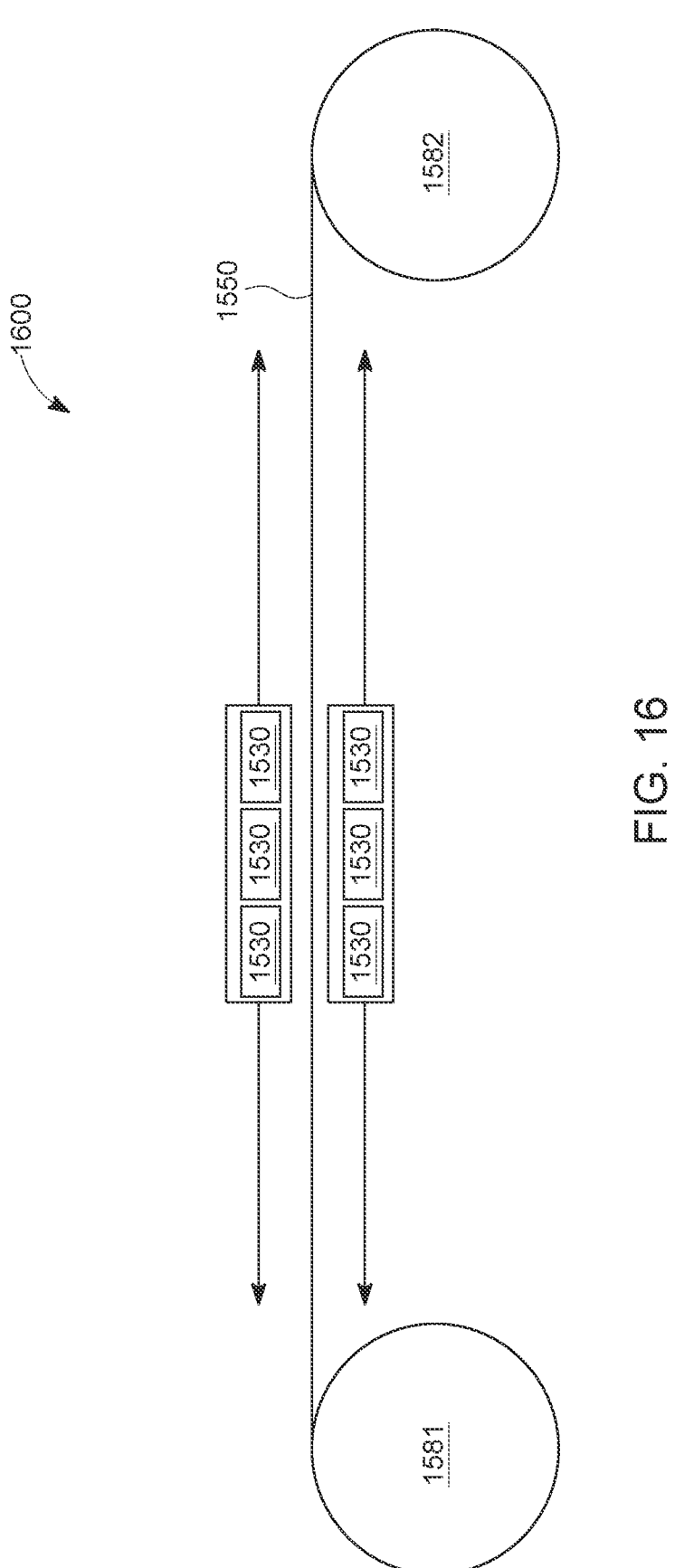
FIG. 16 illustrates an exemplary roll-to-roll system according to the methods and systems disclosed herein.

FIG. 16 illustrates an exemplary roll-to-roll system 1600. The substrate 1550 is a thin film rolled from the unwind roll 1581 to the wind-up roll 1582. In this embodiment, the unwind roll 1581 and the wind-up roll 1582 can function as either a carriage system or as part of the positioning system. In the illustrated embodiment, the shrouds 1530 also shuttle back-and-forth over the substrate 1550 while the substrate 1550 moves. Reaction product only forms proximal the underside of the shrouds 1530. Therefore, the unwind roll 1581 and the wind-up roll 1582 can be within the reaction chamber, without undesired product building up on undesired surfaces. In the system 600, multiple shrouds 1530 (and associated electrodes) are located on both sides of the thin film substrate 1550. Optionally, one or more shrouds 1530 may only be located on one side of the thin film substrate 1550.

Figure 17:
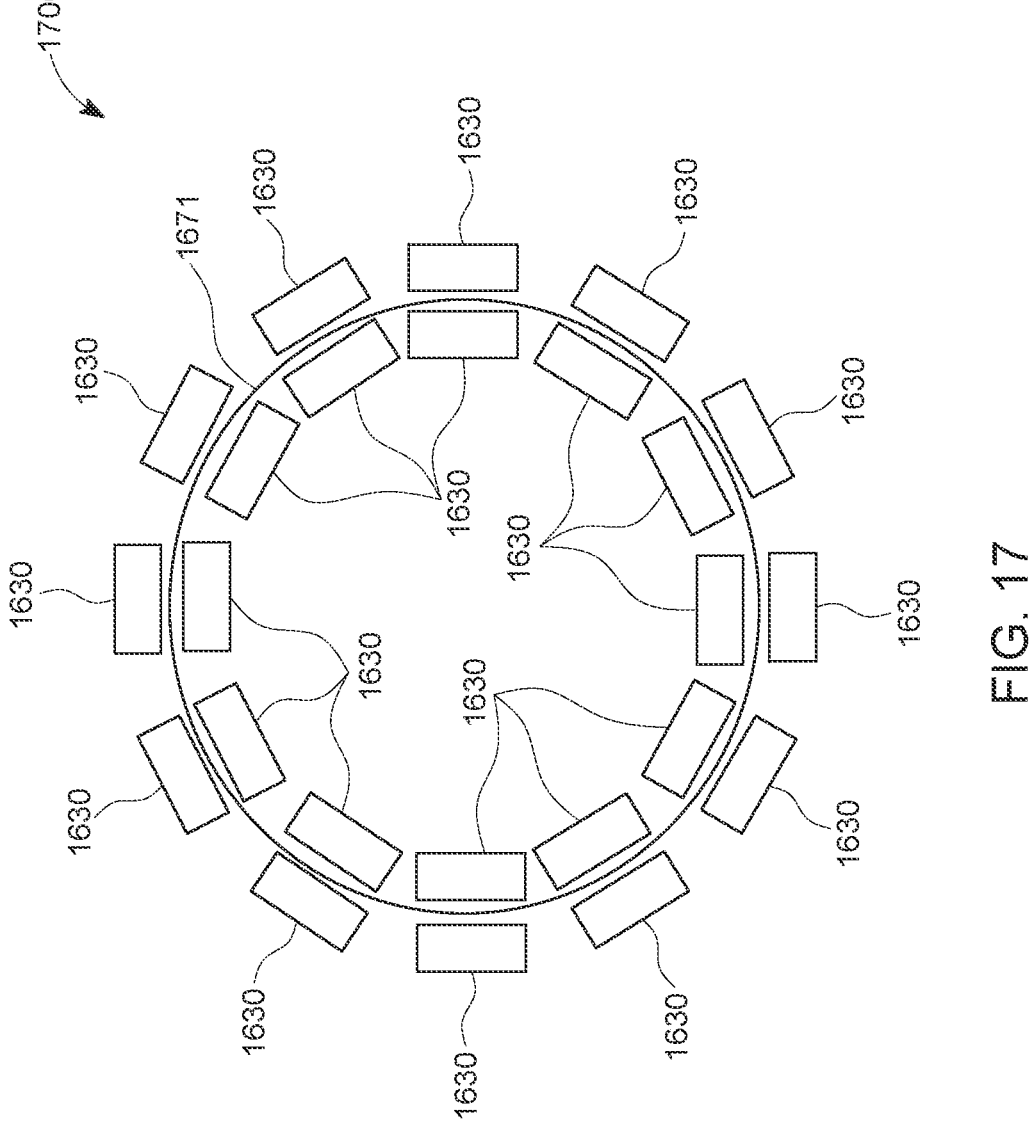
FIG. 17 illustrates an exemplary cylindrical system according to the methods and systems disclosed herein.

FIG. 17 illustrates an exemplary cylindrical rotary system 1700. The system 1700 includes a cylindrical carrier 1671 that rotates about a central axis and is the positioning system. Substrates (not shown), such as disc-shaped silicon wafers, can be mounted on the surface of the cylindrical carrier 1471. Substrates of other types and shapes may also be utilized. For example, the cylindrical carrier 1471 may be a scaffolding for holding optical lenses to be coated on both sides of each lens. The cylindrical carrier 1671 spins about its axis within a reaction chamber (not shown). The substrates are transported along a circular transport path sequentially passing in between the underside of each of the shrouds 1630. Each full revolution results in 24 complete ALD cycles, since there are 24 shrouds 1630 in the illustrated embodiment.

In the system 1700, multiple shrouds 1630 (and associated electrodes) are located on both sides of the cylindrical carrier 1671 and oriented towards the substrates. Optionally, multiple shrouds 1630 may only be located on one side of the cylindrical carrier 1671.

The systems disclosed herein may be integrated with other processes without damaging the other processing system. The ALD reaction product only grows on surfaces proximal the shrouds. Therefore, printheads and other processing equipment can be in the same reaction chamber as the ALD equipment. This could potentially reduce both equipment costs and reduce floor space needed for manufacturing semiconductors and other devices.

The phrase "operably connected to" or "operably coupled to" refers to any form of interaction between two or more entities, including mechanical, electrical, magnetic, electromagnetic, fluid, and thermal interaction. Two entities may interact with each other even though they are not in direct contact with each other. For example, two entities may interact with each other through an intermediate entity.

Without further elaboration, it is believed that one skilled in the art can use the preceding description to utilize the present disclosure to its fullest extent. The examples and embodiments disclosed herein are to be construed as merely illustrative and exemplary and not a limitation of the scope of the present disclosure in any way. It will be apparent to those having skill in the art, and having the benefit of this disclosure, that changes may be made to the details of the above-described embodiments without departing from the underlying principles of the disclosure herein.

The invention claimed is:

1. A system for depositing a thin film on a substrate, the system comprising:

a reaction chamber, including an inlet for introducing a precursor gas into the reaction chamber;

a shroud located within the reaction chamber, the shroud positioned such that the inlet is located outside of the shroud to introduce the precursor gas outside of the shroud, the shroud operably coupled to a secondary gas supply system configured to flow a secondary gas into the shroud, the shroud configured to direct the secondary gas towards a substrate, when the substrate is present in the reaction chamber and positioned proximal to a perimeter of the shroud, and so that the secondary gas exits the shroud along the perimeter and into the reaction chamber where the secondary gas mixes with the precursor gas;

a radical generator operably coupled to the shroud, the radical generator configured to generate a gaseous radical species from the secondary gas and to introduce the gaseous radical species inside of the shroud, when the secondary gas is present and flowing; and a positioning system configured to alternately position the shroud over selected regions of the substrate, when the substrate is present in the reaction chamber, to thereby alternately expose the selected regions of the substrate to the gaseous radical species and the precursor gas multiple times, each exposure of to the precursor gas resulting in some of the precursor gas adsorbing on the selected regions of the substrate as an adsorbed precursor, and each subsequent exposure of the selected regions of the substrate to the gaseous radical species resulting in some of the radicals converting at least a portion of the adsorbed precursor to a product in the selected regions, whereby a thin film is formed in the selected regions of the substrate; and wherein the shroud further comprises a radical deactivation device including a deactivating surface extending outwardly from the perimeter of the shroud and facing an exposed surface of the substrate, when the substrate is present in the reaction chamber and positioned proximal to the perimeter, to create a gap, between the deactivating surface and the exposed surface of the substrate, through which the gaseous radical species flows as the secondary gas exits the shroud, the deactivating surface sized to allow time for substantial recombination or other deactivation of radicals present in the gaseous radical species as the gaseous radical species flows through the gap, prior to the secondary gas exiting the shroud, to thereby prevent the gaseous radical species from interacting with the precursor gas in the reaction chamber outside of the shroud.

2. The system of claim 1, wherein the radical generator is located within an interior of the shroud for generating radicals in-situ from the secondary gas.

3. The system of claim 2, wherein the radical generator comprises a plasma generator.

4. The system of claim 1, wherein a substrate proximal surface of the radical generator is configured to be in close proximity to the substrate and the shroud comprises a housing sized and configured to surround the radical generator on all sides other than the substrate proximal surface, such that when the secondary gas is present and flowing within the shroud, the shroud directs the secondary gas between the substrate proximal surface of the radical generator and the exposed surface of the substrate.

5. The system of claim 1, wherein the reaction chamber includes a printhead within the reaction chamber.

6. The system of claim 2, wherein the radical generator comprises a UV light source.

7. The system of claim 1, wherein the radical generator is located in a flow path of the secondary gas upstream of an interior volume of the shroud within which the gaseous radical species is introduced, when the secondary gas is flowing.

8. The system of claim 1, wherein the deactivating surface is configured to generate laminar flow of the gaseous radical species between the deactivating surface and the exposed surface of the substrate.

9. The system of claim 1, wherein the radical deactivation device includes a getter, a catalyst, a charged electrode, or combinations thereof.

10. The system of claim 1, further comprising a pump for pumping a continuous flow of the secondary gas into the shroud at sufficient flow and pressure conditions to substantially prevent the precursor gas from flowing into the shroud, during operation.

11. The system of claim 1, wherein the positioning system moves the substrate relative to the shroud.

12. The system of claim 1, wherein the positioning system moves the substrate in an x-y plane proximal the shroud.

13. The system of claim 1, further comprising a carriage configured to rotate axially a cylindrical substrate, rotate radially a circular substrate, advance linearly a rectangular substrate, or advance roll-to-roll a thin film substrate.

14. The system of claim 13, wherein the positioning system is configured to move transverse to a direction the carriage is configured to move.

15. The system of claim 1, further comprising:

additional shrouds located within the reaction chamber, the additional shrouds operably coupled to the secondary gas supply system, the additional shrouds configured to direct the secondary gas towards the substrate, when the substrate is present in the reaction chamber;

each of the additional shrouds operably coupled to an additional radical generator, each additional radical generator configured to generate the gaseous radical species from the secondary gas and to introduce the gaseous radical species inside of the additional shroud, when the secondary gas is present and flowing.

16. The system of claim 15, wherein some of the additional shrouds are oriented to coat a backside of a substrate opposite the exposed surface of the substrate, when the substrate is present in the reaction chamber.

17. The system of claim 1, wherein the deactivating surface is configured to induce turbulent flow of the gaseous radical species in the gap between the deactivating surface and the exposed surface of the substrate.

18. The system of claim 1, wherein the positioning system moves the shroud relative to the substrate and the reaction chamber.

19. The system of claim 1, wherein the deactivating surface extends from the perimeter of the shroud a distance that is not uniform around the perimeter.

\* \* \* \* \*